(12) United States Patent
Grahn et al.

(10) Patent No.: US 6,202,589 B1
(45) Date of Patent: Mar. 20, 2001

(54) GROUNDING MECHANISM WHICH MAINTAINS A LOW RESISTANCE ELECTRICAL GROUND PATH BETWEEN A PLATE ELECTRODE AND AN ETCH CHAMBER

(75) Inventors: Stephanie A. Grahn; Donald L. Friede; Toby J. Winters, all of Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/087,548

(22) Filed: May 29, 1998

(51) Int. Cl.$^7$ ..................................................... C33L 16/00

(52) U.S. Cl. .................................. 118/723 R; 118/723 I; 156/345; 204/192.12

(58) Field of Search .............................. 156/345; 118/715, 118/723 E, 723 I, 723 R, 723 ER; 204/192.12; 174/2, 5, 15.6, 24

(56) References Cited

U.S. PATENT DOCUMENTS

| | | | |
|---|---|---|---|
| 6,019,060 | * | 2/2000 | Lenz ................................. 118/723 R |
| 6,027,604 | * | 2/2000 | Lim et al. ............................. 156/345 |
| 6,046,425 | * | 4/2000 | Kaji et al. ........................ 219/121.43 |

OTHER PUBLICATIONS

Beryllium Copper Fingerstock; general description by Technit: EMI Shielding Products, downloaded and printed from http://tecknit.com on Mar. 18, 1998, 1 page.

Beryllium Copper EMI Shielding Gaskets; general description by Technit: EMI Shielding Products, downloaded and printed from http://tecknit.com on Mar. 18, 1998, 2 pages.

* cited by examiner

Primary Examiner—Gregory Mills
Assistant Examiner—Alva C Powell
(74) Attorney, Agent, or Firm—Kevin L. Daffer; Conley, Rose & Tayon

(57) ABSTRACT

An etch apparatus is presented including a grounding mechanism which maintains a low resistance electrical ground path between a plate electrode and a chamber despite temperature variations. The etch apparatus includes a chamber having a removable upper housing, a plate electrode positioned within the upper housing, and a grounding mechanism positioned between the plate electrode and the upper housing such that it contacts both the plate electrode and the upper housing. The grounding mechanism electrically couples the plate electrode to the upper housing. Several embodiments of the grounding mechanism include at least one sheet of metal folded to form two sections extending in an acute angle relative to one another. In two embodiments, the folded sheet of metal forms two sections meeting at a crease. Each of the two sections has an outer edge opposite the crease. At least one of the two sections is segmented by cutting in a direction perpendicular to the outer edge and the crease to form multiple strips or "fingers" extending outwardly from the crease. In one embodiment, a first of the two sections is substantially flat, and the second section is bowed such that the distance between the two sections is greatest midway between the crease and the outer edge of the second section. A second embodiment includes a cylindrical resilient member positioned between the two sections and parallel to the crease. A third embodiment includes two curved sheets of metal and multiple clamps distributed over the length of the grounding mechanism.

6 Claims, 4 Drawing Sheets

GROUNDING MECHANISM WHICH MAINTAINS A LOW RESISTANCE ELECTRICAL GROUND PATH BETWEEN A PLATE ELECTRODE AND AN ETCH CHAMBER

FIELD OF THE INVENTION

This invention relates to the manufacture of integrated circuits, and more particularly to etching apparatus for patterning layers of select materials formed upon surfaces of semiconductor wafers.

DESCRIPTION OF RELATED ART

A wafer fabrication process typically forms many identical integrated circuits upon each of several silicon wafers processed as a group (i.e., lot). Each integrated circuit consists of electronic devices electrically coupled by conductive traces called interconnect lines (i.e., interconnects). Interconnects are typically patterned from conductive layers formed on or above the surface of a silicon substrate. One or more conductive layers may be patterned to form one or more levels of interconnects vertically spaced from each other by one or more interlevel dielectric layers. Dielectric-spaced interconnect levels allow formations of densely patterned devices on relatively small surface areas.

Interconnects on different levels are commonly coupled electrically using contact structures formed in holes etched through interlevel dielectric layers separating the interconnects (i.e., vias). Following the formation and patterning of an interconnect level, an interlevel dielectric layer is deposited over the interconnect level. Prior to the formation and patterning of a subsequent interconnect level, vias are etched through the interlevel dielectric layer in locations where interconnects on different interconnect levels are to be connected. Metal via "plugs" are then formed within in the via openings. A via filled with a metallic via plug comprises a contact structure which electrically couples interconnects on different levels.

Vias are preferably substantially vertical openings, and are typically formed using non-isotropic (i.e., anisotropic) plasma (i.e., "dry") etch techniques. Anisotropic etch techniques etch an exposed material at a greater rate in one direction than any other. An anisotropic etch process which etches an interlevel dielectric layer at a greater rate in the vertical direction is capable of producing vias having substantially vertical side walls.

In a plasma etch process, a glow discharge (i.e., a plasma) is formed when radio frequency (RF) electrical power is applied to reactant gases within a reaction chamber. The reactant gases produce chemically reactive species (atoms, ions, and radicals). These reactive species diffuse to the surface of a material being etched, and adhere to (i.e., are adsorbed upon) the surface of the material. A chemical reaction occurs, with the formation of volatile by-products. These by-products are released (i.e., desorbed) from the surface and diffuse into the ambient.

The above described plasma etch process is substantially a chemical process and removes material at approximately the same rate in all directions (i.e., is an isotropic process). Anisotropic etching requires an etching process having a directional property as described above. Several different etch apparatus operate with a semiconductor wafer placed between two parallel electrodes within the reaction chamber. In such apparatus, an electrical bias may be applied between the parallel electrodes such that energetic ions are directed at an exposed surface of the semiconductor wafer. The directing of the energetic ions adds a significant physical component to the otherwise substantially chemical etch process. When the exposed surface of the semiconductor wafer is parallel to the electrodes, the energetic ions under the influence of the electrical bias strike the surface at an angle normal to the surface (i.e., in the vertical direction). The resulting vertical component of the etch process is capable of forming features (e.g., vias) with substantially vertical side walls.

FIG. 1 is a cross-sectional view of an exemplary etch apparatus 10 currently used for anisotropic etching. Etch apparatus 10 includes a chamber 12. Etch apparatus 10 may be, for example, an HDP Centura® Model 5300 etch apparatus made by Applied Materials, Inc., Santa Clara, Calif. Chamber 12 includes a wafer chuck 14 for holding a semiconductor wafer 16 in place during processing, and an RF coil 18 for imparting energy to a reactant gas within chamber 12. A cooling ring 20 forms a removable upper housing of chamber 12. Cooling ring 20 houses a plate electrode 22, a heating plate 24, and a chill plate 26. Heating plate 24 may include, for example, an electric heating element. Heating plate 24 is used to maintain plate electrode 22 at a desired temperature during processing. Water is circulated through chill plate 26 to cool the exterior surface of cooling ring 20 during use.

Etch apparatus 10 is a parallel-electrode (planar) plasma etch apparatus. Wafer chuck 14 is one of two parallel electrodes, and plate electrode 22 is the other parallel electrode. During use, chamber 12 is held at a ground electrical potential, and wafer chuck 14 is held at a negative electrical potential with respect to chamber 12. An electrostatic force may be used to hold a backside surface of wafer 16 against a planar upper surface of wafer chuck 14. A grounding ring 28 electrically couples plate electrode 22 to cooling ring 20. During processing, cooling ring 20 is physically and electrically coupled to chamber 12.

During use, chamber 12 is first evacuated via an exit port 30. One or more reactant gases are then introduced into chamber 12 via an entry port 32. A first source of RF electrical power is then applied to RF coil 18, resulting in the ionization of the reactant gases within chamber 12. A second source of RF electrical power is then applied to wafer chuck 14 while chamber 12 and plate electrode 22 are held at the ground potential. The second source of RF electrical power causes energetic ions to be directed at an exposed frontside surface of semiconductor wafer 16. The energetic ions strike the frontside surface of wafer 16 at an angle normal to the frontside surface (i.e., in the vertical direction), resulting in the formations of features having substantially vertical side walls.

Prior to placement of semiconductor wafer 16 within chamber 12, a layer of photoresist material is typically formed upon a frontside surface of wafer 16 over a layer to be patterned (e.g., an interlevel dielectric layer). The layer of photoresist material is then patterned to define the desired features. Remaining portions of the photoresist layer form a mask which protects the underlying portions of the layer to be patterned.

A problem arises when using etch apparatus 10 to form vias in an interlevel dielectric layer. During bombardment of the overlying photoresist layer by energetic ions, organic material is released from the photoresist layer. The organic material forms what is believed to be a polymer layer at the bottoms of the vias. The polymer layer is non-volatile, and often blocks complete removal of the interlevel dielectric material from the vias. Carbon-based polymer materials are poor conductors of electricity, and result in an increase in the electrical resistance of contact structures subsequently formed in the vias. Highly resistive contact structures in critical signal paths of integrated circuits deleteriously reduce the maximum operating speeds of the integrated circuits.

Plate electrode 22 may be made from a material (e.g., silicon) which attracts and holds or "getters" a substantial amount of the organic material derived from the photoresist layer during processing. To adequately perform its gettering function, however, silicon plate electrode 22 must remain substantially electrically grounded.

In at least one commercially available etch apparatus 10, grounding ring 28 which electrically couples plate electrode 22 to cooling ring 20 is a Monel™ mesh forced into a gap between an outer periphery of silicon plate electrode 22 and an inner surface of cooling ring 20. Monel™ is a proprietary name for a nickel-copper alloy which is highly resistant to corrosion.

During use, the temperature of silicon plate electrode 22 may rise to as high as approximately 280° C., and may fall to as low as about 20° C. between uses. After a period of time, experience has shown that Monel™ mesh grounding ring 28 no longer adequately couples plate electrode 22 to cooling ring 20. It is believed that the width of the gap between the outer periphery of silicon plate electrode 22 and the inner surface of cooling ring 20 increases and decreases with temperature variations. The Monel™ mesh may be compressed when the gap is relatively small. The compressed Monel™ mesh is not substantially resilient and therefore may not sufficiently expand between compression cycles to maintain a constant low resistance electrical ground path between plate electrode 22 and cooling ring 20 when the gap is relatively large. As a result, over time Monel™ mesh grounding ring 28 does not adequately couple plate electrode 22 to cooling ring 20 as evidenced by increased electrical resistances of contact structures formed in vias etched using etch apparatus 10.

It would thus be desirable to have an etch apparatus including a grounding mechanism which maintains a low resistance electrical ground path between a plate electrode and a chamber despite temperature variations. Such an etch apparatus may be advantageously used to consistently form low resistance contact structures between integrated circuit interconnects on different levels.

SUMMARY OF THE INVENTION

The problems outlined above are in large part solved by a grounding mechanism which maintains a low resistance electrical ground path between a plate electrode and an etch chamber despite temperature variations. The etch apparatus includes an electrically conductive chamber having a removable upper housing, a plate electrode positioned within the upper housing, and a grounding mechanism positioned between and in electrical contact with the plate electrode and the upper housing. The grounding mechanism electrically couples the plate electrode to the upper housing.

Several embodiments of the grounding mechanism described herein include at least one sheet of metal folded to form two sections extending in an acute angle relative to one another. In two embodiments, the folded sheet of metal forms two sections meeting at a crease. Each of the two sections has an outer edge opposite the crease. One or both of the two sections may be segmented by cutting in a direction perpendicular to the outer edge and the crease to form multiple strips or "fingers" extending outwardly from the crease.

In one embodiment of the grounding mechanism, a first of the two sections is substantially flat. The second section is bowed such that the distance between the two sections is greatest midway between the crease and the outer edge of the second section. Only a distal end of the second section abuts a distal end of the first section. One or both sections may be segmented as described above. The grounding mechanism may be positioned such that the first section contacts an inner surface of the upper housing and the second section contacts an outer periphery of the plate electrode. The first section of the grounding mechanism may be attached to the inner surface of the upper housing using, for example, an electrically conductive adhesive.

A second embodiment of the grounding mechanism includes a cylindrical resilient member positioned between the two sections and parallel to the crease. Both sections may be substantially flat, and a cross section of the folded sheet of metal may be substantially "V"-shaped. The cylindrical member may be continuous along the entire length of the sheet of metal. The two sections of the folded sheet of metal have adjacent inner surfaces, and each inner surface may have a groove running parallel to the crease and extending the entire length of the corresponding section. The grooves may be formed by a stamping process performed upon the sheet of metal (e.g., prior to folding). The cylindrical resilient member may be positioned between the grooves of the two sections.

A third embodiment of the grounding mechanism includes two curved sheets of metal and multiple clamps distributed over the length of the grounding mechanism. Each curved sheet of metal has a bend substantially along a centerline and two outer edges opposite the bend. A cross section of each of the two curved sheets of metal may be substantially "U"-shaped. The outer edges of each curved sheet of metal are notched, and the two curved sheets of metal are engaged such that the notches mesh and the bends oppose one another. Each clamp extends between the bends of the two curved sheets of metal and forces the outer edges of the two curved sheets of metal away from one another when tightened.

In one embodiment, each clamp includes an upper member, a screw, and a locking member. Each upper member has a top and bottom surface. The bottom surface of each upper member corresponds to the shape of the bends of the two curved sheets of metal. Each upper member has a threaded hole extending between the top and bottom surfaces. The screw has a head and a threaded body. The threaded body extends through the threaded hole in the upper member, through a first hole in the bend of a first of the two curved sheets of metal, and through a second hole in the second of the two curved sheets of metal. The screw extends through the two curved sheets of metal such that the head is adjacent to the upper member and a portion of the threaded body extends below the bend of the second curved sheet of metal. The locking member is fixedly attached to the portion of the threaded body of the screw extending below the bend of the second curved sheet of metal.

Turning the screw in one direction reduces the distance between the bends in the curved sheets of metal, forcing the outer edges of the curved sheets of metal away from the screw and toward the plate electrode and the cooling ring. Turning the screw in this direction constitutes "tightening" of the corresponding clamp. Proper tightening of the clamps helps ensure that a low resistance electrical path is maintained between the plate electrode and the cooling ring despite temperature variations.

BRIEF DESCRIPTION OF THE DRAWINGS

Other objects and advantages of the invention will become apparent upon reading the following detailed description and upon reference to the accompanying drawings in which:

FIG. 4b is a cross-sectional view of the embodiment of the grounding apparatus shown in FIG. 4a;

FIG. 4c is a side elevational view the embodiment of the grounding apparatus shown in FIG. 4a;

FIG. 5b is a cross-sectional view of the curved sheets of metal of FIG. 5a;

FIG. 5c is a side elevational view of the curved sheets of metal of FIG. 5a; and FIG. 5d is a top plan view of the cooling ring and the plate electrode of FIG. 2 showing an exemplary distribution of a set of clamps along the length of the grounding mechanism of FIG. 5a.

Figure 1:
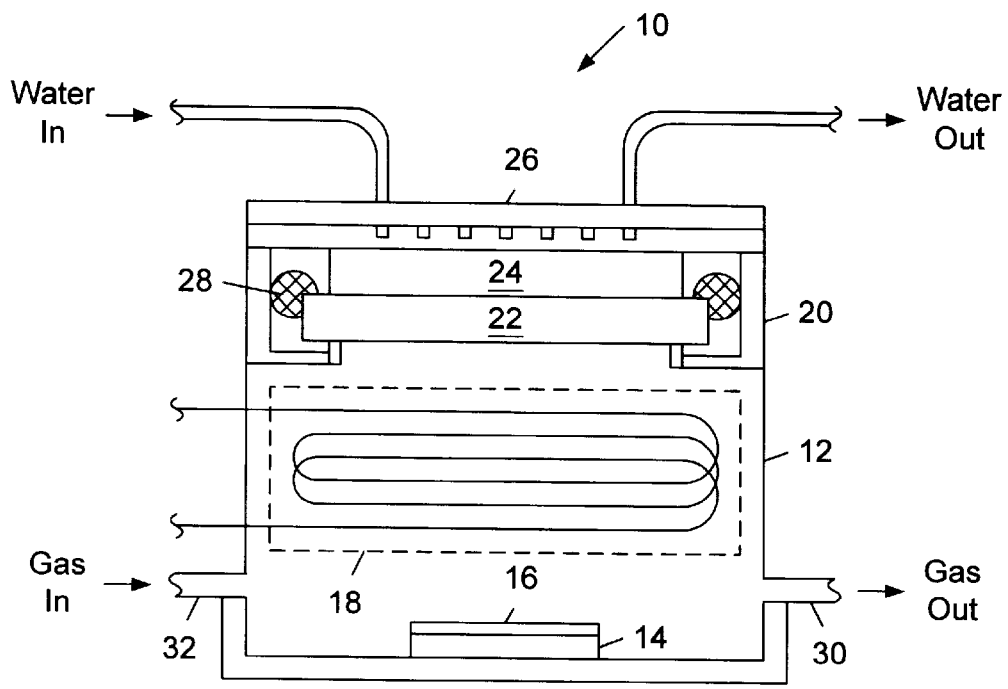
FIG. 1 is a cross-sectional view of an exemplary etch apparatus currently used for anisotropic etching.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Figure 2:
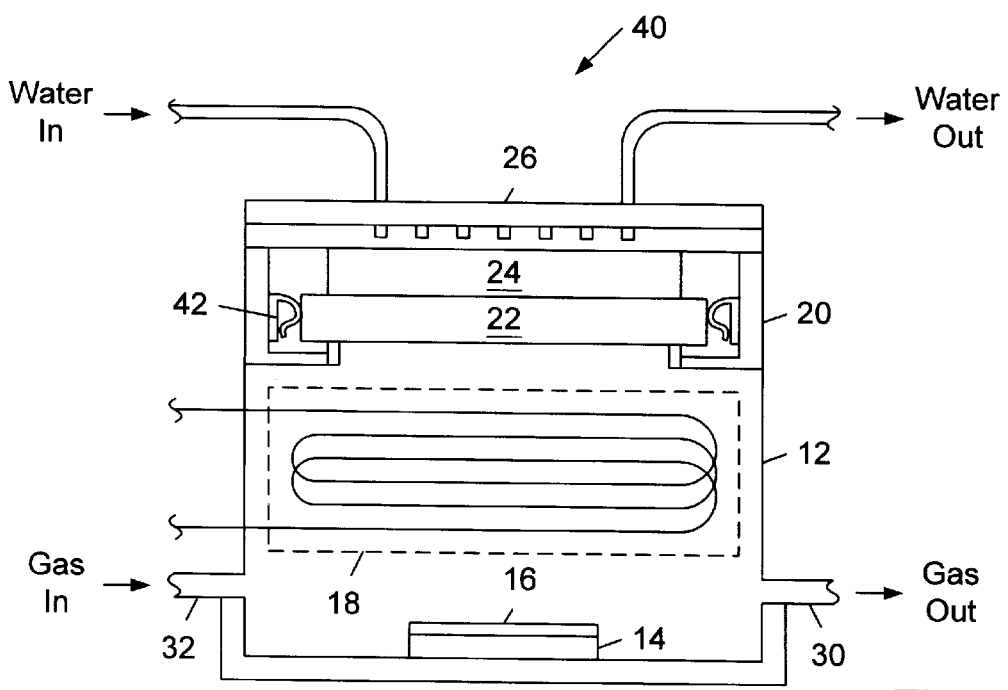
FIG. 2 is a cross-sectional view of one embodiment of an etch apparatus in accordance with the present invention, wherein the etch apparatus includes a grounding mechanism which maintains a low resistance electrical ground path between a plate electrode and a cooling ring despite temperature variations.

FIG. 2 is a cross-sectional view of one embodiment of an etch apparatus 40 in accordance with the present invention. Elements of etch apparatus 40 found in etch apparatus 10 described above are numbered similarly. Etch apparatus 40 may be used for anisotropic etching. Etch apparatus 40 includes an electrically conductive chamber 12 and a removable cooling ring 20 which forms an upper housing of chamber 12. Cooling ring 20 is also electrically conductive. As described above, cooling ring 20 houses plate electrode 22, heating plate 24, and chill plate 26. Etch apparatus 40 also includes a grounding mechanism 42 which maintains a low resistance electrical ground path between plate electrode 22 and cooling ring 20 despite temperature variations.

Etch apparatus 40 is a parallel-electrode (planar) plasma etch apparatus. Wafer chuck 14 is one of two parallel electrodes, and plate electrode 22 is the other parallel electrode. Plate electrode 22 may be made of silicon in order to getter a significant amount of organic material released from a photoresist layer during an etch process. During use, chamber 12 is held at a ground electrical potential, and wafer chuck 14 is held at a negative electrical potential with respect to chamber 12. An electrostatic force holds a backside surface of wafer 16 against a planar upper surface of wafer chuck 14. The operation of etch apparatus 40 is the same as that of etch apparatus 10 described above.

Grounding mechanism 42 is positioned within a gap between an outer periphery of plate electrode 22 and an inner surface of cooling ring 20, and electrically couples plate electrode 22 to cooling ring 20. When removable plate electrode 22 is positioned within cooling ring 20, grounding mechanism 42 contacts both plate electrode 22 and cooling ring 20. Cooling ring 20 is physically and electrically coupled to chamber 12 during processing, and held at ground potential. FIG. 2 illustrates one embodiment of grounding mechanism 42 in accordance with the present invention.

Figure 3A:
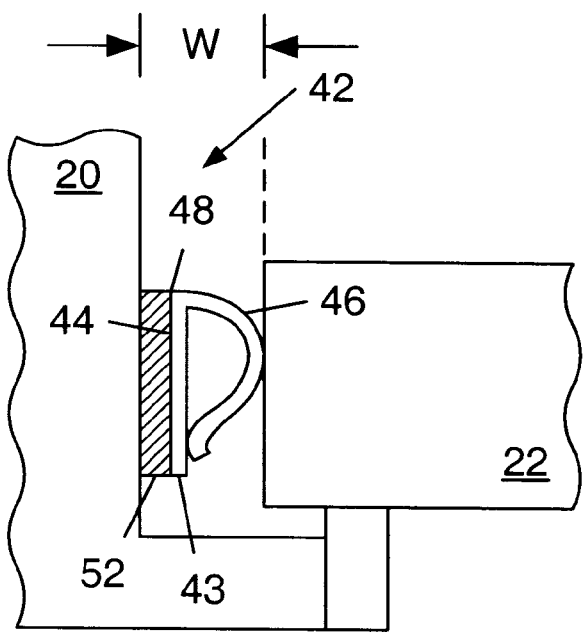
FIG. 3a is an exploded view of a portion of the etch apparatus of FIG. 2 illustrating the embodiment of the grounding apparatus shown in FIG. 2.
Figure 3B:
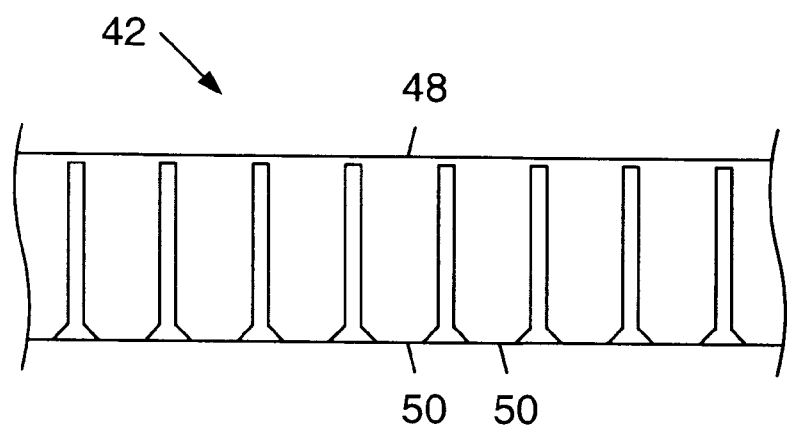
FIG. 3b is a side elevational view of the embodiment of the grounding apparatus shown in FIG. 2.

FIG. 3a is an exploded view of a portion of etch apparatus 40 illustrating the embodiment of grounding apparatus 42 shown in FIG. 2. FIG. 3b is a side elevational view the embodiment of grounding apparatus 42 shown in FIGS. 2 and 3a. In the embodiment of FIGS. 2 and 3a–b, grounding mechanism 42 is a patterned sheet of metal 43 folded over upon itself to form a first section 44 and a second section 46. First section 44 and second section 46 extend in an acute angle relative to one another, and meet at a crease 48. Each section has an outer edge opposite crease 48. First section 44 is substantially flat. Second section 46 is segmented by cutting in a direction perpendicular to the outer edge of second section 46 and crease 48, forming multiple strips or "fingers" 50 extending outwardly from crease 48. Second section 48 is bowed such that the distance between the first section 44 and second section 46 is greatest midway between crease 48 and the outer edge of the second section.

First section 44 contacts an inner surface of cooling ring 20, and fingers 50 contact an outer periphery of plate electrode 22. First section 44 may be attached to the inner surface of cooling ring 20 by an electrically conductive adhesive layer 52. Adhesive layer 52 is preferably made from a material which can withstand temperature variations between about 20° C. and approximately 280° C. It s noted that first section 44 may also be segmented in the same manner as second section 46.

Grounding mechanism 42 is positioned within the gap between the outer periphery of plate electrode 22 and the inner surface of cooling ring 20 as shown in FIGS. 2 and 3a. The gap has a width w as shown in FIG. 3a. Width w may be, for example, about 3/32 in. at room temperature. Width w varies with changing temperatures of plate electrode 22 and cooling ring 20 during processing within etch apparatus 40. As described above, temperatures within chamber 12 range from about 20° C. to approximately 280° C. during processing.

Sheet of metal 43 is preferably made of a metal which retains its shape despite compressive forces and temperature variations. Sheet of metal 43 may be made of, for example, Monel™, beryllium copper, or stainless steel. Fingers 50 are preferably resilient such that a low resistance electrical path is maintained between plate electrode 22 and cooling ring 20 despite changes in width w due to temperature variations.

Figure 4A:
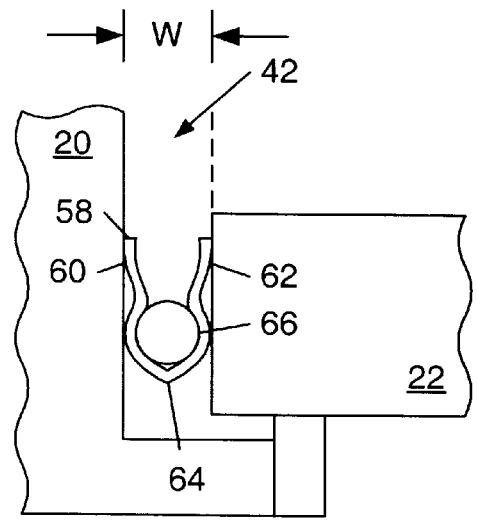
FIG. 4a is an exploded view of a portion of the etch apparatus of FIG. 2 illustrating a second embodiment of the grounding apparatus.
Figure 4B:
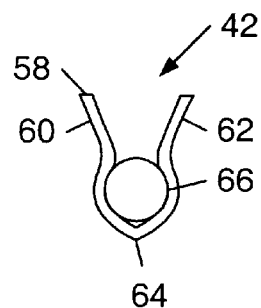
Figure 4C:
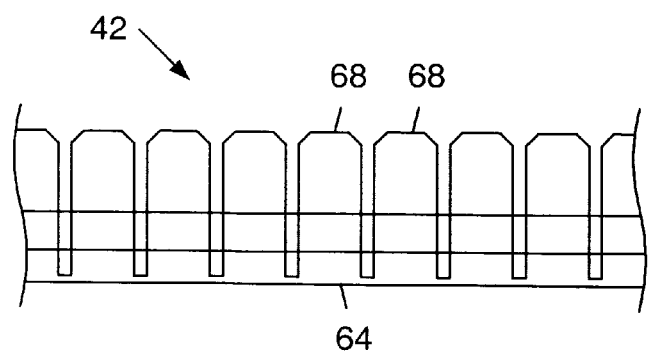

FIG. 4a is an exploded view of a portion of FIG. 2 illustrating a second embodiment of grounding apparatus 42. FIG. 4b is a cross-sectional view of the embodiment of grounding apparatus 42 shown in FIG. 4a. FIG. 4c is a side elevational view of the embodiment of grounding apparatus 42 shown in FIG. 4a. In the embodiment of FIGS. 4a–c, grounding mechanism 42 includes a sheet of metal 58 folded over upon itself to form a first section 60 and a second section 62. First section 60 and second section 62 extend in an acute angle relative to one another, meet at a crease 64, and have outer edges opposite crease 64. Grounding mechanism 42 also includes a cylindrical resilient member 66 positioned between first section 60 and second section 62. Cylindrical resilient member 66 runs parallel to crease 64, and helps maintain contact between grounding mechanism 42, plate electrode 22, and cooling ring 20 despite temperature variations.

First section 60 and second section 62 are both substantially flat. Second section 62 may be segmented by cutting in a direction perpendicular to the outer edge of second section 62 and crease 64, forming multiple fingers 68 extending outwardly from crease 64. First section 60 may be segmented in a similar manner by cutting in a direction perpendicular to the outer edge of second section 62 and crease 64, forming multiple fingers extending outwardly from crease 64.

As shown in FIG. 4b, a cross section of folded sheet of metal 58 is substantially "V"-shaped. Cylindrical resilient member 66 is preferably continuous, extending an entire length of sheet of metal 58. First section 60 and second section 62 have adjacent inner surfaces. Each inner surface preferably has a groove running parallel to crease 64 and extending the entire length of sheet of metal 58. The grooves may be formed by a stamping process performed upon sheet of metal 58 (e.g., prior to folding). Cylindrical resilient member 66 is preferably positioned between the grooves of first section 60 and second section 62 as shown in FIG. 4b.

Sheet of metal 58 is preferably made of a metal which retains its shape despite compressive forces and temperature variations. Sheet of metal 58 may be made of, for example, Monel™, beryllium copper, or stainless steel. Fingers 68 are preferably resilient such that a low resistance electrical path is maintained between plate electrode 22 and cooling ring 20 despite changes in width w due to temperature variations.

Cylindrical resilient member 66 is preferably made from a material which retains its shape despite compressive forces and temperature variations. As described above, temperatures within chamber 12 range from about 20° C. to approximately 280° C. during processing. Cylindrical resilient member 66 may be made of, for example, Teflon™.

The embodiment of grounding mechanism 42 shown in FIGS. 4a–c may be installed after plate electrode 22 is positioned within cooling ring 20. Grounding mechanism 42 may be pressed into the gap between the outer periphery of plate electrode 22 and the inner surface of cooling ring 20 by applying downward force upon cylindrical resilient member 66.

Figure 5A:
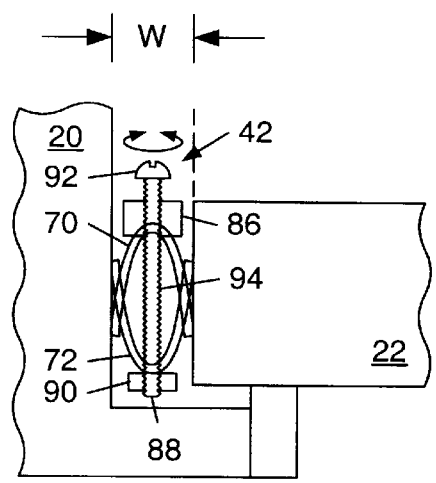
FIG. 5a is an exploded view of a portion of the etch apparatus of FIG. 2 illustrating a third embodiment of the grounding apparatus, wherein the third embodiment includes two curved sheets of metal.
Figure 5B:
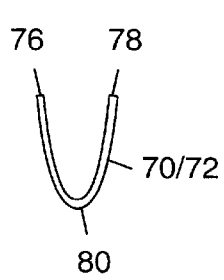
Figure 5C:
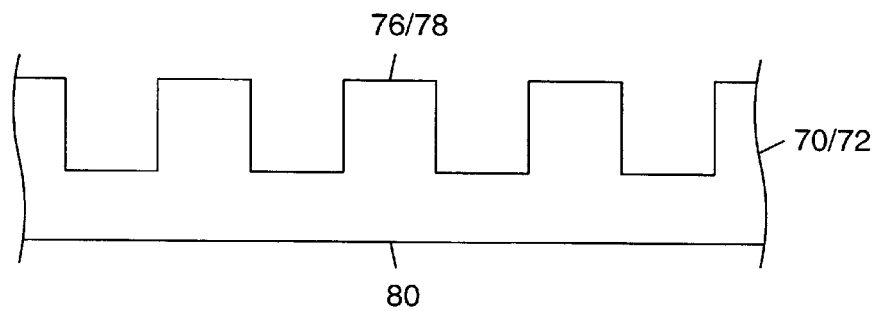

FIG. 5a is an exploded view of a portion of etch apparatus 40 illustrating a third embodiment of grounding apparatus 42. The third embodiment of grounding mechanism 42 includes a first curved sheet of metal 70, a second curved sheet of metal 72, and multiple clamps distributed along a length of grounding member 42. FIG. 5b is a cross-sectional view of curved sheets of metal 70 and 72. FIG. 5c is a side elevational view of curved sheets of metal 70 and 72.

As shown in FIG. 5b, each curved sheet of metal is substantially "U"-shaped and has two outer edges 76 and 78 opposite a bend 80. Bend 80 is formed substantially along a centerline of the curved sheets of metal. Each curved sheet of metal has two sections extending in an acute angle relative to one another. Outer edges 76 and 78 are notched. As shown in FIG. 5a, curved sheets of metal 70 and 72 are engaged such that the notches mesh and bends 80 oppose one another.

FIG. 5a also shows one of the multiple clamps distributed along the length of grounding member 42. Each clamp extends between first curved sheet of metal 70 and second curved sheet of metal 72. When tightened, each clamp forces the outer edges of the two curved sheets of metal away from one another, increasing contact force between grounding mechanism 42, plate electrode 22, and cooling ring 20.

Each curved sheet of metal is preferably made of a metal which retains its shape despite compressive forces and temperature variations. Curved sheets of metal 70 and 72 may be made of, for example, Monel™, beryllium copper, or stainless steel.

Figure 5D:
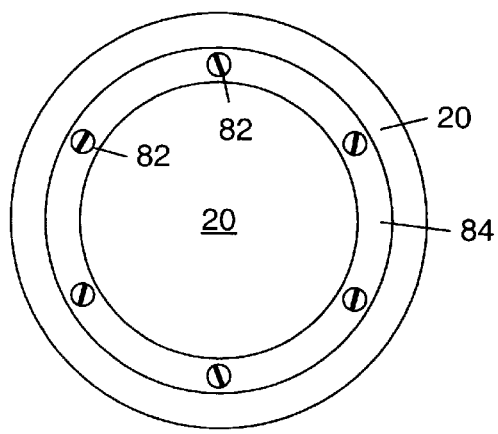

FIG. 5d is a top plan view of cooling ring 20 and plate electrode 22 showing an exemplary distribution of clamps 82 along the length of grounding mechanism 42. Grounding mechanism 42 is positioned within gap 84 between cooling ring 20 and plate electrode 22. As shown in FIG. 5a, each clamp includes an upper member 86, a screw 88, and a locking member 90. Each upper member 86 has a top and bottom surface. The bottom surface corresponds to the shape of bends 80 of the two curved sheets of metal. Each upper member 86 has a threaded hole extending between the top and bottom surfaces.

Screw 88 includes a head 92 and a threaded body 94. Threaded body 94 extends through the threaded hole in upper member 86, through a first hole in bend 80 of first curved sheet of metal 70, and through a second hole in second curved sheet of metal 72. Screw 88 is installed such that head 92 is adjacent to upper member 86 and a portion of threaded body 94 extends below bend 80 of second curved sheet of metal 72. Locking member 90 is fixedly attached to the portion of threaded body 94 extending below bend 80 of second curved sheet of metal 72. Locking member 90 turns with screw 88, and may be a nut attached to threaded body 94 (e.g., by an adhesive, by soldering, by welding, etc.). Locking member 90 may also include two nuts tightened together.

Turning screw 88 in one direction reduces the distance between bends 80 in first curved sheet of metal 70 and second curved sheet of metal 72, forcing outer edges 76 and 78 of both curved sheets of metal away from screw 88 and toward plate electrode 22 and cooling ring 20. Turning screws 88 in this direction constitutes "tightening" of clamps 82. Proper tightening of clamps 82 helps ensure that a low resistance electrical path is maintained between plate electrode 22 and cooling ring 20 despite changes in width w due to temperature variations.

It will be appreciated by those skilled in the art having the benefit of this disclosure that this invention is believed to be an etch apparatus including a grounding mechanism which maintains a low resistance electrical ground path between a plate electrode and a chamber despite temperature variations. It is intended that the following claims be interpreted to embrace all such modifications and changes and, accordingly, the specification and drawings are to be regarded in an illustrative rather than a restrictive sense.

What is claimed is:

1. An apparatus for removing material from a surface of a semiconductor wafer, comprising:
   a chamber having a removable upper housing;
   a plate electrode positioned within the upper housing; and
   a grounding mechanism comprising a sheet of metal folded over upon itself to form two sections meeting at a crease, wherein the grounding mechanism is positioned between and in electrical contact with the plate electrode and the removable upper housing.

2. The apparatus as recited in claim 1, wherein the grounding mechanism electrically couples the plate electrode to the upper housing.

3. The apparatus as recited in claim 1, wherein at least one of the two sections is segmented to form a plurality of separate fingers extending outwardly from the crease.

4. The apparatus as recited in claim 1, wherein each of the two sections has an outer edge opposite the crease, and wherein the a first of the two sections is substantially flat, and wherein the second section is bowed such that the distance between the two sections is greatest midway between the crease and the outer edge of the second section.

5. The apparatus as recited in claim 4, wherein the grounding mechanism is positioned such that the first section contacts an inner surface of the upper housing and the second section contacts an outer periphery of the plate electrode.

6. The apparatus as recited in claim 4, wherein the first section of the grounding mechanism is attached to the inner surface of the upper housing.

* * * * *